United States Patent
Schiller et al.

(10) Patent No.: US 7,528,570 B2
(45) Date of Patent: May 5, 2009

(54) METHOD AND DEVICE FOR PREDICTING THE STARTING ABILITY OF A VEHICLE

(75) Inventors: Karsten Schiller, Korntal-Muenchingen (DE); Frank Buchholz, Hochdorf (DE)

(73) Assignee: Robert Bosch GmbH, Stuttgart (DE)

( * ) Notice: Subject to any disclaimer, the term of this patent is extended or adjusted under 35 U.S.C. 154(b) by 332 days.

(21) Appl. No.: 10/553,619

(22) PCT Filed: Mar. 17, 2004

(86) PCT No.: PCT/DE2004/000535

§ 371 (c)(1),
(2), (4) Date: Oct. 17, 2005

(87) PCT Pub. No.: WO2004/092758

PCT Pub. Date: Oct. 28, 2004

(65) Prior Publication Data

US 2006/0208739 A1    Sep. 21, 2006

(30) Foreign Application Priority Data

Apr. 16, 2003    (DE) ............................... 103 17 524

(51) Int. Cl.
H01M 10/46 (2006.01)
(52) U.S. Cl. ..................................... 320/104

(58) Field of Classification Search ................. 320/104, 320/132, 149; 324/426, 430, 431, 433
See application file for complete search history.

(56) References Cited

U.S. PATENT DOCUMENTS

| 5,565,759 | A   | 10/1996 | Dunstan |
| 6,300,763 | B1  | 10/2001 | Kwok |
| 6,424,157 | B1  | 7/2002  | Gollomp et al. |
| 2005/0017686 | A1* | 1/2005 | Sakakibara et al. ......... 320/132 |

FOREIGN PATENT DOCUMENTS

| DE | 1 056 970 | 5/1959 |
| DE | 197 05 634 | 8/1998 |
| EP | 0 714 033 | 5/1996 |
| JP | 6-059003 | 3/1994 |
| WO | WO 00/04620 | 1/2000 |

\* cited by examiner

Primary Examiner—Edward Tso
(74) Attorney, Agent, or Firm—Kenyon & Kenyon LLP

(57) ABSTRACT

A device for predicting the starting ability of a vehicle having an internal combustion engine and a starter which is supplied with electrical power by a vehicle battery. The starting ability of the vehicle can be determined particularly easily when a starting current characteristics map is stored in a device of the prediction system from which a starting current is determined under consideration of the state of charge of the battery after a predefined time period and the starting ability of the vehicle is determined from this via a prediction device.

12 Claims, 3 Drawing Sheets

METHOD AND DEVICE FOR PREDICTING THE STARTING ABILITY OF A VEHICLE

FIELD OF THE INVENTION

The present invention relates to a device and method for predicting the starting ability of a vehicle.

BACKGROUND INFORMATION

Due to the increasing number of silent consumers such as the IR receiver of the central locking system, anti-theft device, sensors, etc., vehicles have substantial power consumption, even when shut off. There is the risk that a shut-off vehicle may no longer be able to be started after a prolonged standstill. Therefore, devices indicating the starting ability are used to inform the driver.

A device for predicting the starting ability of a vehicle indicates how long a vehicle may be shut off until the vehicle battery is discharged to a point that the vehicle is just able to be restarted or whether a start is still possible after a predefined time has elapsed. The starting ability of a vehicle is normally assumed when the battery is able to provide a predefined electric starting power without falling short of a set minimum terminal voltage.

German Patent Application No. DE 197 05 634, for example, describes determining the starting ability of a vehicle at a predefined starting current and a given starting temperature by calculating the terminal voltage of the battery during a starting operation. The terminal voltage is calculated from the no-load voltage and the internal resistance of the starter battery. The starting current is measured during the starting operation. A prediction about a future starting ability of a vehicle is not possible. In addition, it is relatively complex to measure the starting current of the battery during a starting operation.

A method for determining the starting ability of a vehicle is described in German Patent Application No. DE 1056970 in which an average voltage drop in the battery is calculated during a starting phase and it is determined whether or not a minimum terminal voltage of the battery was not met. This method also places high demands on the sensor for measuring the battery voltage and additionally requires constant calculation of the battery behavior during a starting operation. Moreover, a prediction about the future starting ability of a vehicle is not possible.

SUMMARY

An object of the present invention is to provide a device and a method for predicting the future starting ability of a vehicle in which absolutely no measurements of starting currents or voltages of the vehicle battery are necessary.

In accordance with the present invention, the future starting ability of a vehicle is determined not on the basis of measured starting currents or voltages, but rather, the starting ability of the vehicle is determined based on a characteristics map (composed of one or multiple characteristic curves) of an electrical battery variable such as the starting current. For this purpose, a characteristics map, in which the dependency of an electrical battery variable, e.g., the starting current flowing through the starter, on a second battery variable, e.g., the state of charge SOC of the battery, is represented, is stored in the device for predicting the starting ability. The value of the first electrical battery variable present during a future starting operation, e.g., a starting current value, may be easily read out from the characteristics map when the future second battery variable, e.g., the future state of charge (SOCnew), is known. The value read out from the characteristics map is a measure of the starting ability of the vehicle at the future starting instant. This method has the advantage that absolutely no starting currents or voltages have to be measured during the start in order to determine the starting ability.

The characteristics map of the electrical battery variable may be determined for a predefined battery type and a predefined starting system via measurements on the test bench. The empirically determined characteristics map subsequently has only to be stored in the prediction system, so that the anticipated value of the first electrical battery variable, such as the future battery current or battery voltage, may be determined. As a function of the second battery variable, the device in which the characteristics map is stored outputs the value of the first electrical battery variable which would be present during a future starting operation. The output variable of the device is, for example, a starting current or a battery voltage which appears during a future starting operation and may be used to determine the starting ability.

According to a preferred example embodiment of the present invention, the device for predicting the starting ability of a vehicle includes a battery state detection device for determining the state of charge (SOC) of the vehicle battery, a device which determines charge (deltaSOC) drawn from the vehicle battery during a predefined shut-off period from the discharge current curve in the shut-off vehicle and calculates remaining state of charge (SOCnew) of the vehicle battery after the predefined shut-off period, a device for determining a first electrical battery variable from a stored characteristics map which outputs a value of the electrical battery variable which would appear during a future start, and a prediction device which determines, based on the output electrical battery value, whether the vehicle is able to start after the predefined shut-off period.

The characteristics map may be stored either in the form of a function or in the form of value pairs. The characteristic curves of the characteristics map are preferably current, voltage, or charge characteristic curves as a function of the state of charge of the battery, for example.

Greater prediction accuracy may be achieved if the temperature dependency of the battery and the starting system is taken into account. In this case, the characteristics map is additionally a function of temperature T.

The temperature prevailing at a future start may be determined using a device for temperature prediction, for example. Since it is impossible to accurately predict the temperature prevailing at the starting instant (the nighttime temperature may substantially differ from the daytime temperature), an average of already measured temperatures is preferably determined over a predefined period. For generating an average, a low-pass filter, situated downstream from the temperature sensor, may be used, for example. The temperature average is preferably taken into account in determining the first electrical battery variable.

A characteristics map of a mechanical variable of the starting system (the starting system includes all driven parts up to the engine), such as a torque characteristics map as well as an engine torque characteristic curve, is preferably stored in the prediction device. The torque characteristics map of the starting system is preferably also determined via test bench measurements.

The torque characteristics map of the starting system is a function of an electrical battery variable, e.g., the state of charge or the internal resistance of the battery. As a function of the determined first electrical battery variable, the associated torque characteristic curve is determined from the torque characteristics map under consideration of at least state of charge SOCnew. The prediction device may thus determine the starting ability of the vehicle via a torque comparison.

The prediction accuracy may be improved again if the temperature is taken into account in determining the starting torque. The characteristic curves of the torque characteristics map of the starting system may therefore also be stored as a function of the temperature.

The characteristics map of the first electrical battery variable may be optionally adapted to the instantaneous state of the starting system which is influenced by different operating variables. The characteristics map of the first electrical battery variable is, as mentioned above, determined via test bench measurements under defined conditions, such as a defined coolant temperature, a defined battery internal resistance, a defined state of glow plugs, etc. A change of these parameters affects the electrical battery variables, e.g., the starting current, during a starting operation. The actually occurring starting current may thus deviate, for example, from the starting current measured on the test bench. The stored characteristics map of the electrical battery variable may be adapted to changed operating conditions in that the starting current is measured during a starting operation and the characteristics map is adapted accordingly. Using this adaptation algorithm, aging of the internal combustion engine and of components of the starting system in particular, as well as battery and oil changes, may be taken into account.

According to a preferred example embodiment, characteristics maps for different starting systems and engines are stored in the prediction device. The starting system includes all parts of the vehicle which are important for predicting the starting ability, such as, in particular, the transmission, the battery, the starter, etc.

BRIEF DESCRIPTION OF THE DRAWINGS

An example embodiment of the present invention is described in greater detail below based on the figures.

DETAILED DESCRIPTION OF EXAMPLE EMBODIMENTS

Figure 1:
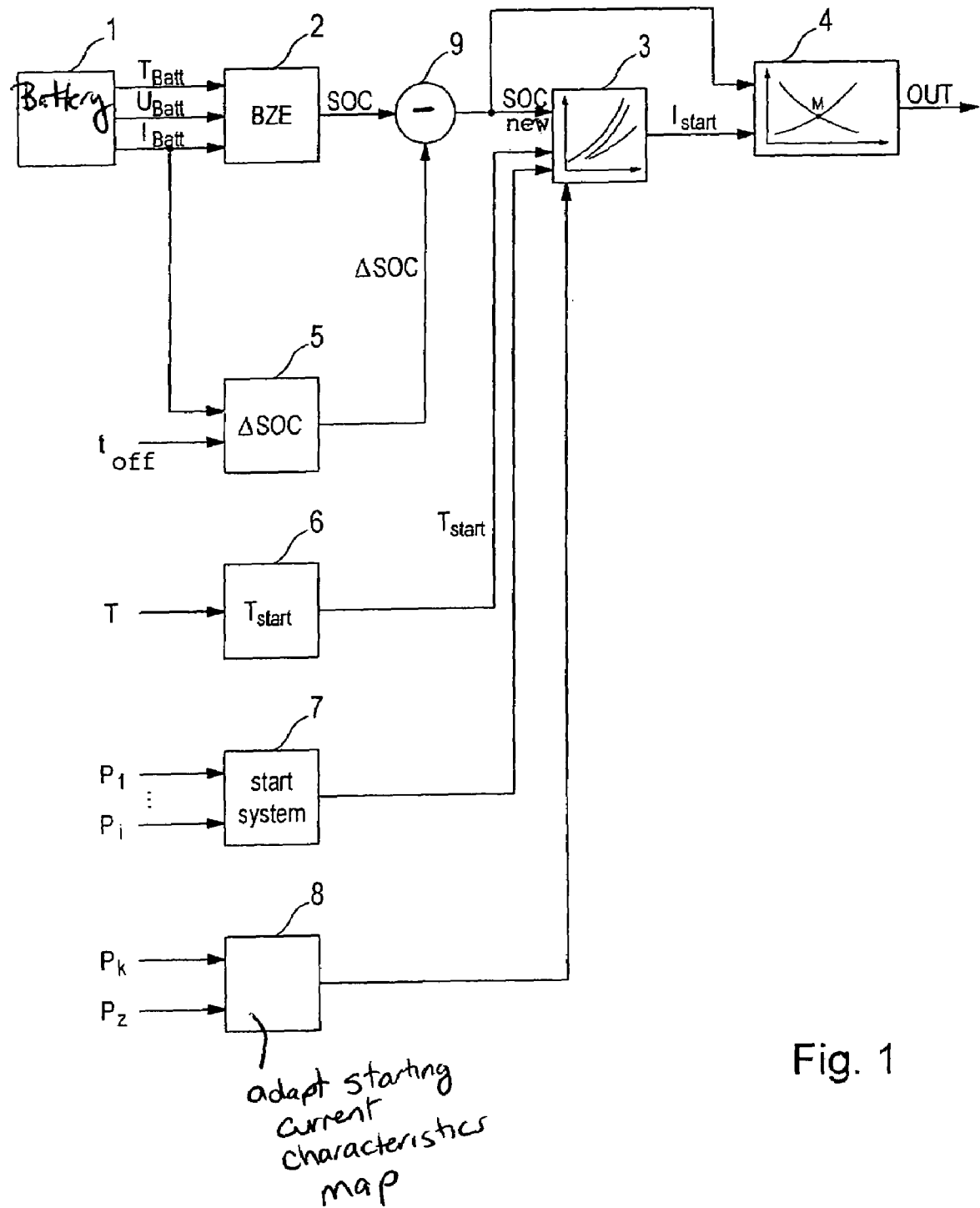
FIG. 1 shows a schematic representation of a device for predicting the starting ability of a vehicle according to an example embodiment of the present invention.

FIG. 1 shows a schematic representation of a device for predicting the starting ability of a vehicle. The starting ability of the vehicle is assumed when a vehicle battery 1 is able to provide sufficient electrical starting power after a predefined shut-off period $t_{off}$ in order to start the vehicle without falling short of a predefined minimum terminal voltage.

The vehicle battery is drained by different silent consumers during the vehicle's shut-off period. Particularly when the battery is weak, the driver must be informed whether the vehicle is able to start after a predefined period, e.g., three days. Alternatively, the driver may also be informed as to how long the vehicle will still be able to start.

Prediction of the starting ability generally relies on determining a future state of charge SOCnew which vehicle battery 1 will have after predefined shut-off period $t_{off}$ and using future state of charge SOCnew to determine starting current $I_{start}$, flowing in the starter during a starting operation, from a starting current characteristics map stored in a device 3. Based on determined future starting current $I_{start}$, it is possible to predict whether the vehicle will be able to start using a prediction device 4.

Using the device for predicting the starting ability, it may optionally also be predicted how long the vehicle will still be able to start. This may be determined, for example, in that shut-off period $t_{off}$ is increased until the result is negative.

A characteristics map of the starting current for different states of charge SOC of starter battery 1 is stored in device 3 for determining a starting current $I_{start}$. The starting current characteristics map may be obtained via test bench measurements and subsequent interpolation of the measured values or via computer simulation. Starting current $I_{start}$, anticipated to flow at a future start, may simply be read out from the characteristics map when future state of charge SOCnew of the battery and possibly the future starting temperature are known. Therefore, no measurement of the battery voltage or the battery current (starting current) during a starting operation is necessary for predicting the starting ability.

Figure 2:
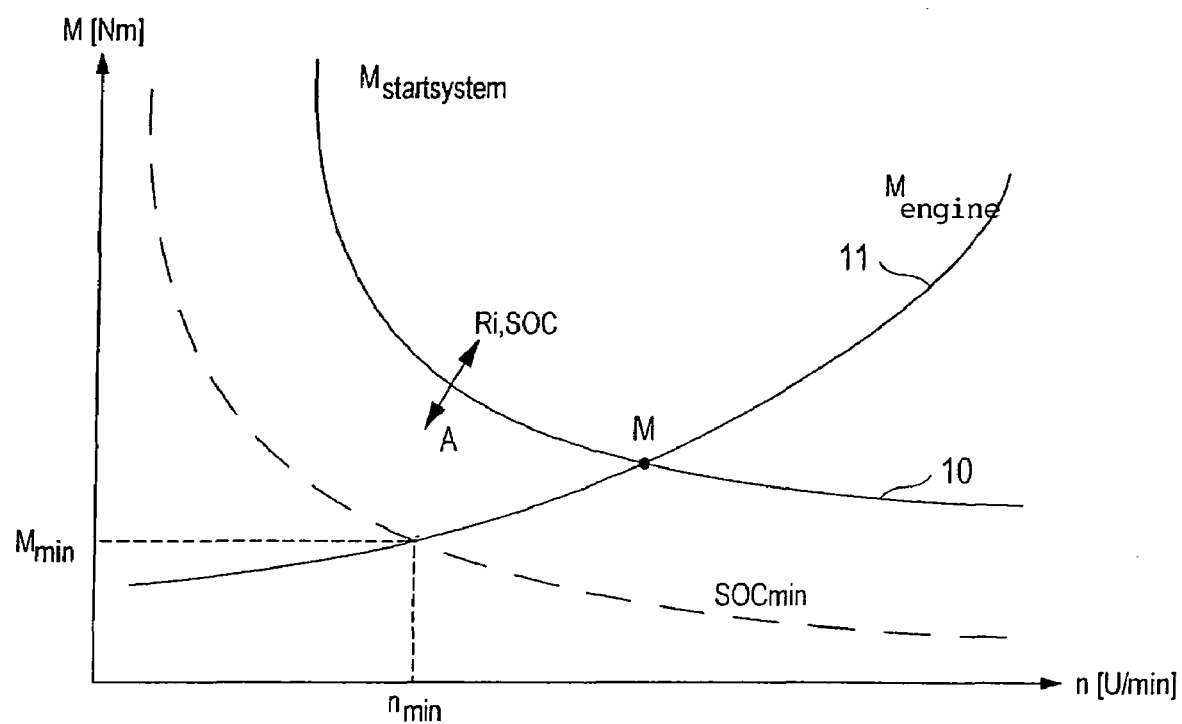
FIG. 2 shows a torque characteristics map of the starting system stored in a prediction device for determining the starting ability of the vehicle.

Starting current value $I_{start}$ determined from characteristics map 3 defines the starting torque generated by the starting system. Given starting current value $I_{start}$ is converted into a torque value for predicting the starting ability of the vehicle. As shown in FIG. 2, a torque characteristics map of starting system $M_{startsystem}$ is stored in prediction device 4. Shown torque characteristic curve 10 again depends on state of charge SOC or on internal resistance Ri and optionally also on temperature T of the starting system. This torque characteristics map $M_{startsystem}$ is also determined via test bench measurements or simulations.

Moreover, prediction device 4 contains an engine torque characteristic curve 11 which is generally constant. The actually acting starting torque M at the future starting instant arises at the intersection of engine torque characteristic curve 11 and torque characteristic curve 10 of the starting system (as a function of future state of charge SOCnew).

The starting ability of the vehicle is established when torque M, determined in such a way, is greater than a required minimum torque $M_{min}$.

During shut-off period $t_{off}$ of the vehicle, current is constantly drained from the battery by different switched-on silent consumers. A device 5, which calculates the drained charge by simply integrating the discharge current, for example, is provided for calculating the drained charge. The discharge current in the shut-off vehicle is preferably measured just after the vehicle is shut off. A more accurate determination of the drained charge may be achieved when the discharge current is measured at multiple points in time after the vehicle is shut off.

Instantaneous state of charge SOC of battery 1 is determined by a conventional battery state detection device 2. Corresponding sensors (not shown) provide battery state detection device 2 with battery temperature $T_{Bat}$, battery voltage $U_{Bat}$, and battery current $I_{Bat}$ as input variables.

State of charge SOCnew of battery 1, which appears after predefined shut-off period $t_{off}$, is calculated by subtracting drained charge deltaSOC from instantaneous charge SOC at subtractor node 9. Subtractor 9, as well as other devices of the prediction system, are preferably implemented in the form of software and run in a control unit, for example.

The prediction accuracy may be improved when the starting current characteristic curves are additionally stored as a function of different starting temperatures and the starting temperature is taken into account in the prediction. For this purpose, the prediction system includes a temperature sensor which measures the ambient temperature. The ambient temperature is supplied to a device 6 for predicting the starting temperature, device 6 evaluating a starting temperature which is anticipated to prevail at the starting instant. For this purpose, an average is preferably formed from multiple temperature values, e.g., the temperature values of the last several hours. In the simplest case, averaging may take place via a low-pass filter having a large time constant and an averaging function.

Device 3 for determining starting current $I_{start}$ preferably includes starting current characteristic curves for different starting systems, i.e., for different starter, engine, transmission types, etc. For calculating the torque demand of the starting system, the displacement, the number of cylinders, the engine type (diesel/gasoline), additional consumer currents (e.g., associated with glow plugs), the transmission type (stick shift or automatic transmission) with corresponding drag torque, and the battery type are of importance. Instantaneous parameters P1 . . . Pi of the starting system are supplied to a selection unit 7 which selects the starting current characteristic curve appropriate for the starting system.

As mentioned above, the starting current characteristics map is determined via test bench measurements or simulation under defined ancillary conditions (ambient temperature, battery type, state of the glow plugs, etc.). These parameters may change during the course of operation. If the instantaneous values are not taken into account when determining the future starting current, the actually occurring starting current may deviate from starting current $I_{start}$ read out from the characteristic curve. Therefore, the characteristics map is preferably adapted to the instantaneous conditions.

For this purpose, starting current measurements, for example, are carried out and the starting current characteristics map, for example, is adapted accordingly by displacing the characteristic curves. Provided that they are known, different parameters Pk . . . Pz (ambient temperature, battery type, state of the glow plugs, etc.) may optionally also be taken into account in order to select the appropriate starting current characteristic curve. In this case, the starting current characteristic curves would be stored as a function of these parameters. Using this adaptation algorithm, the wear and tear in the internal combustion engine and the starting system, in particular, as well as the aging of the battery and oil changes, may be taken into account.

FIG. 2 shows the determination of the starting ability of the vehicle using torque characteristic curves.

For determining an operating point M, which appears during a starting operation, engine torque $M_{engine}$ over speed n and a characteristics map of starting system torque $M_{startsystem}$ are stored in prediction device 4. The torque of starting system $M_{startsystem}$ is in turn a function of state of charge SOC, internal resistance Ri of battery 1, and starting temperature $T_{start}$. If state of charge SOC of the battery is low, torque $M_{startsystem}$, exerted by the starting system, is reduced in the direction of the dashed line which represents the torque curve at the lowest state of charge SOC needed for a successful start.

The characteristics map of starting system torque $M_{startsystem}$ is again determined via test bench measurements or simulation.

Prediction device 4 determines operating point M from starting current $I_{start}$ supplied by device 3 under consideration of state of charge SOCnew of battery 1 and possibly temperature T and internal resistance Ri. Torque M, acting on the engine, occurs at the point where torque $M_{startsystem}$, exerted by the starting system, is equal to engine torque $M_{engine}$. If this operating point M is greater than a minimally required torque $M_{min}$, the vehicle is able to start after predefined shut-off period $t_{off}$.

In order to determine how long the vehicle may be shut off in total without losing its starting ability, predefined shut-off period $t_{off}$ is incrementally increased until operating point M is within predefined minimum limits $M_{min}$, $n_{min}$. Preceding time value $t_{off}$ then approximately reflects the maximum shut-off period.

Figure 3:
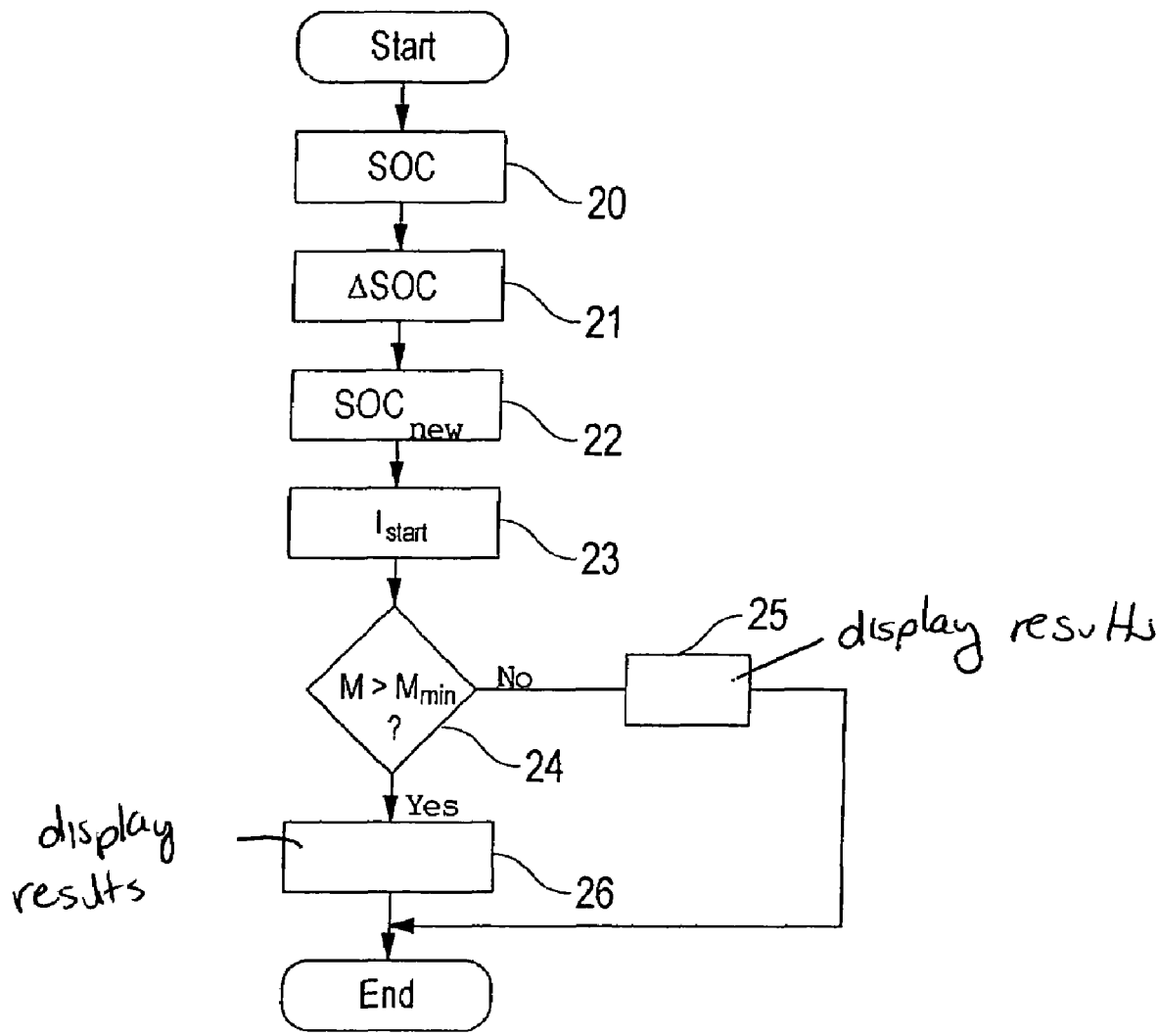
FIG. 3 shows example method steps of a method for predicting the starting ability of a vehicle.

FIG. 3 shows example steps of a method for predicting the starting ability of a vehicle. Instantaneous state of charge SOC of vehicle battery 1 is determined in a first step 20 via a battery state detection device 2. Charge deltaSOC, which is drained from vehicle battery 1 during a predefined time period $t_{off}$ in the shut-off vehicle, is determined in step 21 and state of charge SOCnew of vehicle battery 1 after predefined time period $t_{off}$ is calculated in step 22. In step 23, an electrical battery variable, e.g., future starting current $I_{start}$ on the basis of calculated future state of charge SOCnew of vehicle battery 1, is read out from a characteristics map stored in device 3. Read out starting current value $I_{start}$ is converted into a torque and compared in step 24 to a minimally required torque $M_{min}$ to determine whether the vehicle is able to start (case J) or not (case N) after predefined time period $t_{off}$. The torque comparison is carried out in a prediction device 4. The result is displayed in block 25 or 26 via a suitable display element.

What is claimed is:

1. A device for predicting the starting ability of a vehicle having an internal combustion engine and a starter which is supplied with electrical power by a vehicle battery, comprising:
    a battery state detection device which determines a state of charge of the vehicle battery;
    a first device which uses a discharge current curve to determine a charge drained from the vehicle battery during a predefined time period when the vehicle is shut off;
    a second device which calculates the state of charge of the vehicle battery after the predefined time period;
    a third device that determines an electrical battery variable in which a characteristics map of the electrical battery variable is stored as a function of the state of charge of the vehicle battery, a value of the electrical battery variable, which is present after the predefined time period, being read out from the characteristics map;
    a measurement device configured to measure an electrical variable of the vehicle battery during a starting operation, wherein the measured electrical variable is used to correct the stored characteristics map; and
    a prediction device which uses the read out value of the electrical battery variable to determine whether or not the vehicle is able to start after the predefined time period.

2. The device as recited in claim 1, wherein the characteristics map of the electrical battery variable is one of a current, voltage, or power characteristics map.

3. The device as recited in claim 1, wherein the characteristics map of the electrical battery variable is a function of the temperature.

4. The device as recited in claim 3, further comprising:
    a temperature prediction device to predict a temperature anticipated to prevail after the predefined time period, the predicted temperature being taken into account in the determination of the electrical battery variable.

5. The device as recited in claim 1, wherein a characteristics map of a mechanical variable of a starting system is stored in the prediction device.

6. The device as recited in claim 1, wherein a torque characteristics map of a starting system and an engine torque characteristics curve are stored in the prediction device.

7. The device as recited in claim 6, wherein the engine torque characteristics map of the starting system is a function of the state of charge of the vehicle battery.

8. The device as recited in claim 6, wherein the torque characteristics map of the starting system is a function of the temperature.

9. The device as recited in claim 1, wherein characteristic curves for different starting systems are stored in the third device that determines the electrical battery variable.

10. A method for predicting the starting ability of a vehicle having an internal combustion engine and a starter which is supplied with electrical power by a vehicle battery, the method comprising:
   determining an instantaneous state of charge of the vehicle battery via a battery state detection device;
   determining a charge drained from the vehicle battery during a predefined time period when the vehicle is shut off;
   calculating the state of charge of the vehicle battery after the predefined time period;
   determining an electrical battery variable based on the calculated state of charge of the vehicle battery from a characteristics map stored in a device, wherein at least one measured electrical variable of the vehicle battery measured during a starting operation is used to correct the stored characteristics map; and
   determining whether or not the vehicle is able to start after the predefined time period via a prediction device which determines the starting ability on the basis of the battery variable determined from the characteristics map.

11. The method as recited in claim 10, further comprising:
   storing a characteristics map for a starting current in the device for determining an electrical battery variable as a function of the state of charge of the vehicle battery, a starting current, which occurs after the predefined time period, being determined from the characteristics map.

12. The method as recited in claim 10, further comprising:
   comparing, by a prediction device, an engine torque and a torque of a starting system in order to determine a torque acting in the future.

* * * * *